United States Patent
Xu

(10) Patent No.: US 10,665,824 B2
(45) Date of Patent: May 26, 2020

(54) FLEXIBLE MATERIAL AND PREPARATION METHOD THEREOF, FLEXIBLE COVER PLATE AND PREPARATION METHOD THEREOF

(71) Applicant: Wuhan China Star Optoelectronics Semiconductor Display Technology Co., Ltd., Wuhan, Hubei (CN)

(72) Inventor: Jie Xu, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 249 days.

(21) Appl. No.: 15/745,083

(22) PCT Filed: Dec. 19, 2017

(86) PCT No.: PCT/CN2017/117258
§ 371 (c)(1),
(2) Date: Jan. 15, 2018

(87) PCT Pub. No.: WO2019/052073
PCT Pub. Date: Mar. 21, 2019

(65) Prior Publication Data
US 2019/0386214 A1    Dec. 19, 2019

(30) Foreign Application Priority Data
Sep. 12, 2017   (CN) .......................... 2017 1 0817827

(51) Int. Cl.
| H01L 51/56 | (2006.01) |
| H01L 51/00 | (2006.01) |
| H01L 51/52 | (2006.01) |

(52) U.S. Cl.
CPC .......... *H01L 51/56* (2013.01); *H01L 51/0001* (2013.01); *H01L 51/5253* (2013.01); *H01L 2251/301* (2013.01); *H01L 2251/5338* (2013.01)

(58) Field of Classification Search
CPC . H01L 51/0001; H01L 51/5253; H01L 51/56; H01L 2251/301; H01L 2251/5338
See application file for complete search history.

(56) References Cited

U.S. PATENT DOCUMENTS

| 2013/0207541 A1 | 8/2013 | Bouten |
| 2016/0093685 A1 | 3/2016 | Kwon et al. |

FOREIGN PATENT DOCUMENTS

| CN | 103152893 A | 6/2013 |
| CN | 103570060 A | 2/2014 |

(Continued)

*Primary Examiner* — FeiFei Yeung Lopez
(74) *Attorney, Agent, or Firm* — Hemisphere Law, PLLC; Zhigang Ma

(57) ABSTRACT

The present disclosure provides a method for preparing a flexible material, including: adding barium source material and NaOH to deionized water, and stirring at room temperature to obtain a barium source mixture; transferring the barium source mixture to a vacuum glove box, adding liquid titanium source, and stirring to obtain a mixture of barium source and titanium source; transferring the mixture of barium source and titanium source into a reaction vessel, wherein the reaction is at 160° C.~200° C. for 20~28 hours; obtaining a powdery flexible material by centrifugation, washing and drying, after the reaction vessel was cooled. The flexible material is also used to prepare a transparent flexible cover plate. The method includes: processing the flexible material by physical vapor deposition, chemical vapor deposition or physical coating to obtain the flexible cover plate. The flexible cover plate is used to protect the display panel.

17 Claims, 2 Drawing Sheets

(56) References Cited

FOREIGN PATENT DOCUMENTS

| | | | |
|---|---|---|---|
| CN | 203521480 U | | 4/2014 |
| CN | 104803412 | * | 7/2015 |
| CN | 104803412 A | | 7/2015 |
| CN | 105289588 A | | 2/2016 |
| CN | 105591036 A | | 5/2016 |
| CN | 106033273 A | | 10/2016 |

* cited by examiner

FLEXIBLE MATERIAL AND PREPARATION METHOD THEREOF, FLEXIBLE COVER PLATE AND PREPARATION METHOD THEREOF

RELATED APPLICATIONS

The present application is a National Phase of International Application Number PCT/CN2017/117258, filed Dec. 19, 2017, and claims the priority of China Application CN 201710817827.5, filed Sep. 12, 2017.

FIELD OF THE DISCLOSURE

The present disclosure relates to a display technology field, and more particularly to a flexible material and a preparation method thereof and a flexible cover plate and a preparation method thereof.

BACKGROUND OF THE DISCLOSURE

In the current field of lighting and display, due to the characteristics of active matrix organic light-emitting diodes (AMOLED) themselves, such as self-luminescence, wide color gamut and bendable, more and more are being widely studied for the development of lighting products and panel industries.

At present, the structure of an organic light-emitting diode (OLED) is shown in FIG. 1. Among them, the flexible cover plate material of flexible OLED is the superposition of the transparent polyimide (PI) under development and the hard layer, which is composed of inorganic substance and organic substance. The current hardness of the flexible AMOLED cover plate material is only 4 H (H represents the pencil hardness standard), the thickness is 70 um~100 um, when fitted on the display panel, it is difficult to meet the current market flexibility requirements of the hardness and thickness of the cover plate.

SUMMARY OF THE DISCLOSURE

The present disclosure provides a method for preparing a flexible material, the method for preparing the flexible material is achieved by the following steps:
adding barium source material and NaOH to deionized water, and stirring at room temperature to obtain a barium source mixture;
transferring the barium source mixture to a vacuum glove box, adding liquid titanium source, and stirring to obtain a mixture of barium source and titanium source;
transferring the mixture of barium source and titanium source into a reaction vessel, wherein the reaction is at 160° C.~200° C. for 20~28 hours;
obtaining a powdery flexible material by centrifugation, washing and drying, after the reaction vessel was cooled.

Wherein a molar ratio of barium ions in the barium source material, titanium ions in the liquid titanium source and NaOH is 1:4:32.

Wherein the barium source material includes $Ba(OH)_2$—$H_2O$ or $BaCl_2$, the liquid titanium source includes $TiCl_4$ or butyl titanate, and a concentration of the barium ions in the barium source is 0.1 mol/L~0.4 mol/L.

Wherein the reaction vessel filling degree is 60%~80%, which can be adjusted by adopting a manner of adding deionized water.

Wherein the washing is performed by adding deionized water for washing five to eight times.

Wherein the drying is performed in a blast drier at 50° C. to 60° C. for 24 hours or more.

Wherein other elements such as Al and N may be further added to the barium source mixture by doping.

The present disclosure provides a flexible material prepared by the above method for preparing a flexible material for preparing a transparent flexible cover plate.

According to the present disclosure, a method for preparing a flexible cover plate is provided. The flexible cover plate is obtained by processing the flexible material by means of physical vapor deposition (PVD), chemical vapor deposition (CVD) or physical coating.

The disclosure also provides a flexible cover plate, which is prepared by the above-mentioned preparing method of a flexible cover plate and is used for protecting the display panel. The flexible cover plate can reach ultra-thin thickness of 40 um~70 um, the surface hardness is greater than 8 H, but also can have good waterproof performance through the doping of Al or N, with high reliability.

BRIEF DESCRIPTION OF THE DRAWINGS

To describe the technical solutions in the embodiments of the present disclosure or in the prior art more clearly, the following briefly introduces the accompanying drawings required for describing the embodiments or the prior art. Apparently, the accompanying drawings in the following description show merely some embodiments of the present disclosure, and a person of ordinary skill in the art may still derive other drawings from these accompanying drawings without creative efforts.

DETAILED DESCRIPTION OF PREFERRED EMBODIMENTS

The technical solutions in the embodiments of the present disclosure will be described clearly and completely hereinafter with reference to the accompanying drawings in the embodiments of the present disclosure. Apparently, the described embodiments are merely some but not all embodiments of the present disclosure. All other embodiments obtained by persons of ordinary skill in the art based on the embodiments of the present disclosure without creative efforts shall fall within the protection scope of the present disclosure.

Figure 1:
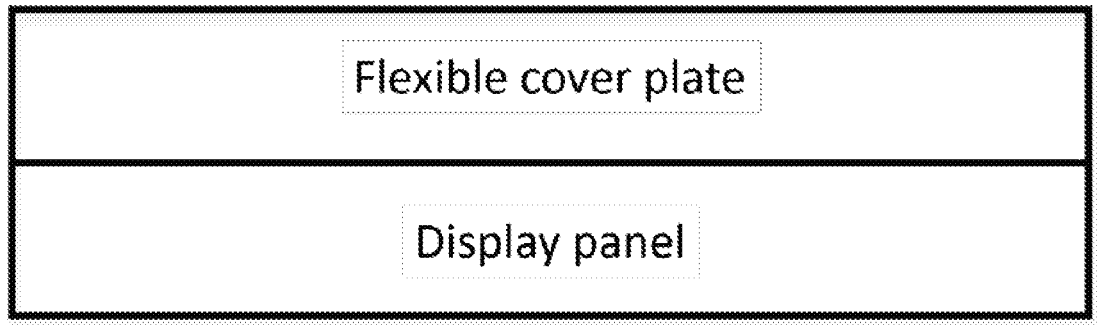
FIG. 1 is a schematic diagram of the current structure of a flexible OLED.
Figure 2:
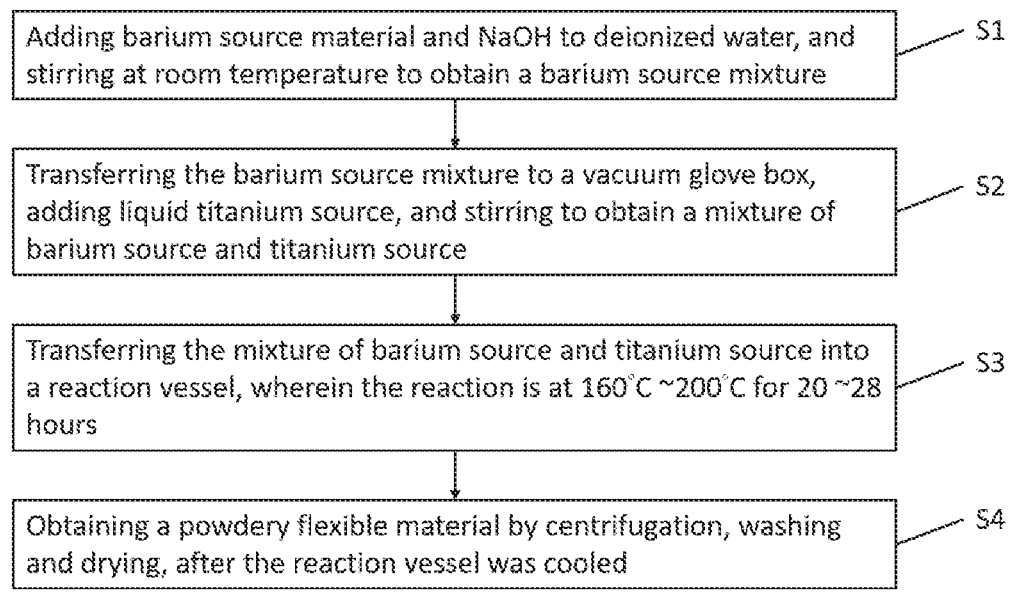
FIG. 2 is a schematic flow chart of the method for preparing a flexible material of the present disclosure.

FIG. 2 is a schematic flow chart of the method for preparing a flexible material of the present disclosure. As shown in FIG. 1, the flexible material of the present disclosure is prepared as follows:

S1, adding barium source material and NaOH to deionized water, and stirring at room temperature to obtain a barium source mixture.

Wherein, the barium source material includes and is not limited to $Ba(OH)_2$—$H_2O$ or $BaCl_2$. In the present embodiment, the barium source material is $Ba(OH)_2$—$H_2O$, the concentration of barium ions is 0.1 mol/L to 0.4 mol/L, the optimum is 0.2144 mol/L, and the molar ratio of barium ions and NaOH is 1:32. The barium source material and NaOH were added to 10 ml to 30 ml of deionized water, stirred at room temperature for 20 min to 40 min to obtain a barium source mixture.

S2, transferring the barium source mixture to a vacuum glove box, adding liquid titanium source, and stirring to obtain a mixture of barium source and titanium source.

Wherein, the liquid titanium source includes and is not limited to $TiCl_4$ or butyl titanate. In the present embodiment, the liquid titanium source is $TiCl_4$, and the molar ratio of barium ions and titanium ions is 1:4. $TiCl_4$ is slowly dripped into the barium source mixture in a vacuum glove box to prevent the $TiCl_4$ from being exposed to air and reacting with water to smoky and deteriorate. After $TiCl_4$ is slowly dripped into the barium source mixture, the mixture of barium source and titanium source can be obtained after stirring for 20 min to 40 min at room temperature.

S3, transferring the mixture of barium source and titanium source into a reaction vessel, wherein the reaction is at 160° C.~200° C. for 20~28 hours.

Wherein, before the reaction vessel starts to heat and keep warm, the filling degree of the reaction vessel is adjusted to be 60%~80% by adding deionized water first. In the present embodiment, adjusting the filling degree of the reaction vessel to 80%, using pH test paper to test the pH value of the reaction solution in the reaction vessel, the pH value of the reaction solution in the reaction vessel at this time can be measured to be 12-13, and then putting the reaction vessel into a thermostatic oven heated to 180° C. and incubated for 24 hours.

S4, obtaining a powdery flexible material by centrifugation, washing and drying, after the reaction vessel was cooled.

In the present embodiment, after the reaction of the reaction vessel is completed by heating, after the reaction vessel is naturally cooled to room temperature, the product in the reaction vessel is taken out, rinsed with deionized water for 5 to 8 times in a high-speed centrifuge and then dried in a blast oven at 50° C. to 60° C. for 24 hours or more.

Specifically, pure barium source and titanium source are used as the reactants in the preparation of the entire flexible material, NaOH is used as the mineralizer, and the mineralizer can promote or control the formation of the compound. The barium source mixture and the mixture of barium source and titanium source in S1 and S2 are all contained in the inner liner of the reaction vessel. In the present embodiment, $Ba(OH)_2$—$H_2O$ and $TiCl_4$ are used as the reactants, and the inner liner of the reaction vessel is a polytetrafluoroethylene inner liner.

In addition, during the preparation of the flexible material, elements such as Al or N may be added to the reactants by adjusting the proportion of the barium source and the titanium source reactant, and the doping process may be performed according to different needs to complete the final design of flexible materials. In the present embodiment, Al and N elements are added to the reactants to finally obtain a flexible material with waterproof properties.

Figure 3:
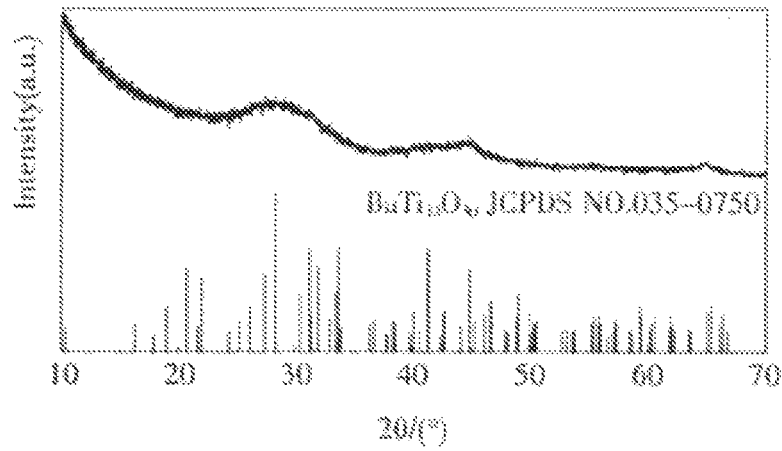
FIG. 3 is an X-ray diffraction pattern structure of the flexible material of the present disclosure.

The flexible material provided by the present disclosure is prepared by the above method for preparing a flexible material for preparing a transparent flexible cover plate. FIG. 3 is an X-ray diffraction pattern of the flexible material provided by the present disclosure. It can be seen from FIG. 3 that, compared with a standard JCPDS card, the flexible material has no diffraction peak, which proves that the product prepared by the preparation method of the flexible material is an amorphous material. The flexible materials include the elements Ba, Ti, and O, depending on the raw materials used in the manufacturing process are barium source and titanium source.

Figure 4:
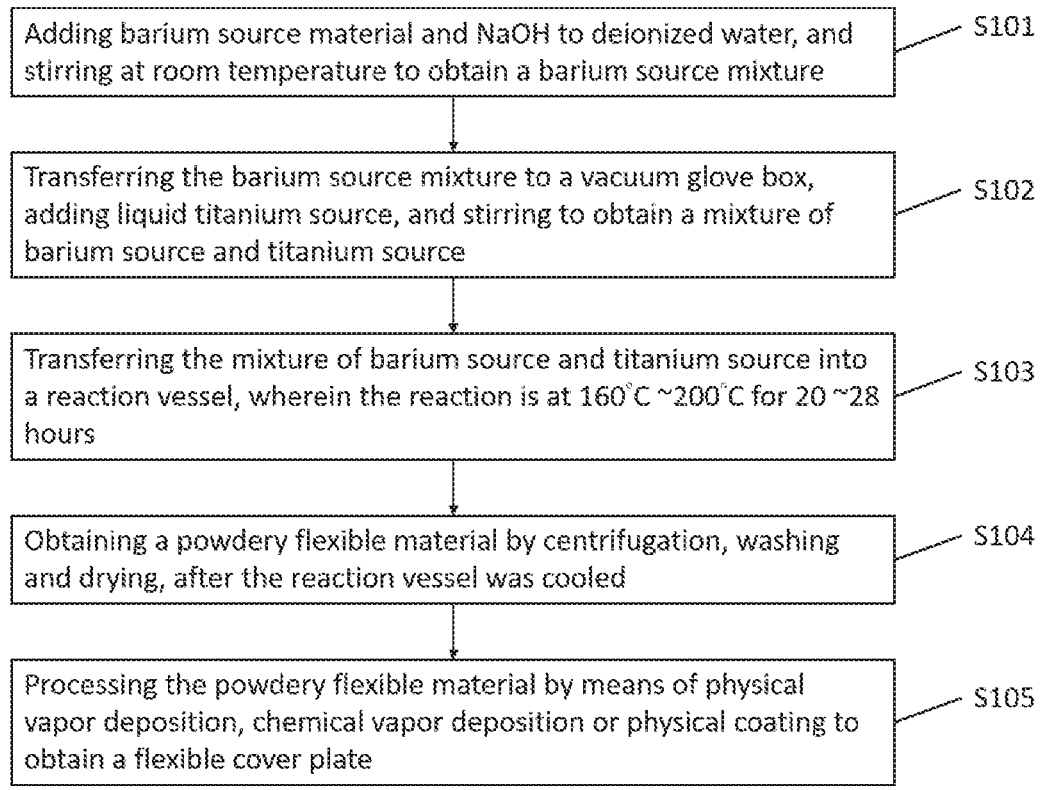
FIG. 4 is a schematic flow chart of the method for preparing a flexible cover plate of the present disclosure.

FIG. 4 is a schematic flow chart of the method for preparing a flexible cover plate of the present disclosure. as shown in FIG. 4, the preparation method of the flexible cover plate of the present disclosure includes:

S101, adding barium source material and NaOH to deionized water, and stirring at room temperature to obtain a barium source mixture.

Wherein, the barium source material includes and is not limited to $Ba(OH)_2$—$H_2O$ or $BaCl_2$. In the present embodiment, the barium source material is $Ba(OH)_2$—$H_2O$, the concentration of barium ions is 0.1 mol/L to 0.4 mol/L, the optimum is 0.2144 mol/L, and the molar ratio of barium ions and NaOH is 1:32. The barium source material and NaOH were added to 10 ml to 30 ml of deionized water, stirred at room temperature for 20 min to 40 min to obtain a barium source mixture.

S102, transferring the barium source mixture to a vacuum glove box, adding liquid titanium source, and stirring to obtain a mixture of barium source and titanium source.

Wherein, the liquid titanium source includes and is not limited to $TiCl_4$ or butyl titanate. In the present embodiment, the liquid titanium source is $TiCl_4$, and the molar ratio of barium ions and titanium ions is 1:4. $TiCl_4$ is slowly dripped into the barium source mixture in a vacuum glove box to prevent the $TiCl_4$ from being exposed to air and reacting with water to smoky and deteriorate. After $TiCl_4$ is slowly dripped into the barium source mixture, the mixture of barium source and titanium source can be obtained after stirring for 20 min to 40 min at room temperature.

S103, transferring the mixture of barium source and titanium source into a reaction vessel, wherein the reaction is at 160° C.~200° C. for 20~28 hours.

Wherein, before the reaction vessel starts to heat and keep warm, the filling degree of the reaction vessel is adjusted to be 60%~80% by adding deionized water first. In the present embodiment, adjusting the filling degree of the reaction vessel to 80%, using pH test paper to test the pH value of the reaction solution in the reaction vessel, the pH value of the reaction solution in the reaction vessel at this time can be measured to be 12-13, and then putting the reaction vessel into a thermostatic oven heated to 180° C. and incubated for 24 hours.

S104, obtaining a powdery flexible material by centrifugation, washing and drying, after the reaction vessel was cooled.

In the present embodiment, after the reaction of the reaction vessel is completed by heating, after the reaction vessel is naturally cooled to room temperature, the product in the reaction vessel is taken out, rinsed with deionized water for 5 to 8 times in a high-speed centrifuge and then dried in a blast oven at 50° C. to 60° C. for 24 hours or more.

S105, processing the powdery flexible material by means of physical vapor deposition, chemical vapor deposition or physical coating to obtain a flexible cover plate.

Specifically, pure barium source and titanium source are used as the reactants in the preparation of the entire flexible cover plate, and NaOH is used as the mineralizer. The mineralizer can promote or control the formation of the compound. The barium source mixture and the mixture of barium source and titanium source in S101 and S102 are all contained in the inner liner of the reaction vessel. In the present embodiment, $Ba(OH)_2$—$H_2O$ and $TiCl_4$ are used as the reactants, and the inner liner of the reaction vessel is a polytetrafluoroethylene inner liner.

In addition, during the preparation of the flexible cover plate, elements such as Al or N may be added to the reactants by adjusting the proportion of the barium source and the titanium source reactant, and the doping process may be performed according to different needs to complete the final design of flexible materials. In the present embodiment, Al and N elements are added to the reactants to finally obtain a flexible cover plate with waterproof properties.

The flexible cover plate provided by the disclosure is prepared through the preparation method of the flexible cover plate, wherein the flexible cover plate can be made into an ultra-thin film with a thickness of 50 um~70 um and a surface hardness of more than 8 H. In addition, since the flexible material for preparing the flexible cover plate can be doped with Al or N element, the resulting flexible cover plate also has better waterproof performance while having ultra-thin and high hardness.

In summary, compared with the existing flexible cover plate, the flexible cover plate provided by the disclosure not only has ultra-thin thickness and strong surface hardness, but also can be designed into flexible cover plates with different performances according to different requirements, thereby greatly improving the reliability of the OLED product.

The above disclosure is only the preferred embodiments of the present disclosure, and certainly can not be used to limit the scope of the present disclosure. Persons of ordinary skill in the art may understand that all or part of the procedures for implementing the foregoing embodiments and equivalent changes made according to the claims of the present disclosure still fall within the scope of the present disclosure.

What is claimed is:

1. A method for preparing a flexible material, comprising:
    adding barium source material and NaOH to deionized water, stirring at room temperature to obtain a barium source mixture, and adding element Al or element N to the barium source mixture by doping;
    transferring the barium source mixture to a vacuum glove box, adding liquid titanium source, and stirring to obtain a mixture of barium source and titanium source;
    transferring the mixture of barium source and titanium source into a reaction vessel, wherein the reaction is at 160° C.~200° C. for 20~28 hours;
    obtaining a powdery material for forming the flexible material by centrifugation, washing and drying, after the reaction vessel was cooled.

2. The method for preparing a flexible material according to claim 1, wherein a molar ratio of barium ions in the barium source material, titanium ions in the liquid titanium source and NaOH is 1:4:32.

3. The method for preparing a flexible material according to claim 2, wherein the barium source material comprises $Ba(OH)_2$—$H_2O$ or $BaCl_2$, the liquid titanium source comprises $TiCl_4$ or butyl titanate, and a concentration of the barium ions in the barium source is 0.1 mol/L~0.4 mol/L.

4. The method for preparing a flexible material according to claim 1, wherein a filling degree of the reaction vessel is 60%~80%, which can be adjusted by a manner of adding deionized water.

5. The method for preparing a flexible material according to claim 1, wherein the washing is performed by adding deionized water for washing five to eight times.

6. The method for preparing a flexible material according to claim 1, wherein the drying is performed in a blast drier at 50° C. to 60° C. for 24 hours or more.

7. A flexible material, prepared by the method of claim 1, for preparing a transparent flexible cover plate.

8. The flexible material according to claim 7, wherein a molar ratio of barium ions in the barium source material, titanium ions in the liquid titanium source and NaOH is 1:4:32.

9. The flexible material according to claim 8, wherein the barium source material comprises $Ba(OH)_2$—$H_2O$ or $BaCl_2$, the liquid titanium source comprises $TiCl_4$ or butyl titanate, and a concentration of the barium ions in the barium source is 0.1 mol/L~0.4 mol/L.

10. The flexible material according to claim 7, wherein a filling degree of the reaction vessel is 60%~80%, which can be adjusted by a manner of adding deionized water.

11. The flexible material according to claim 7, wherein the washing is performed by adding deionized water for washing five to eight times.

12. The flexible material according to claim 7, wherein the drying is performed in a blast drier at 50° C. to 60° C. for 24 hours or more.

13. A method for preparing a flexible cover plate, comprising: preparing a flexible material by the following steps:
    adding barium source material and NaOH to deionized water, stirring at room temperature to obtain a barium source mixture, and adding element Al or element N to the barium source mixture by doping,
    transferring the barium source mixture to a vacuum glove box, adding liquid titanium source, and stirring to obtain a mixture of barium source and titanium source,
    transferring the mixture of barium source and titanium source into a reaction vessel, wherein the reaction is at 160° C.~200° C. for 20~28 hours, and
    obtaining a powdery material for forming the flexible material by centrifugation, washing and drying, after the reaction vessel was cooled.

14. The method for preparing a flexible cover plate according to claim 13, wherein the flexible cover plate is for protecting a display panel.

15. The method for preparing a flexible cover plate according to claim 13, wherein a molar ratio of barium ions in the barium source material, titanium ions in the liquid titanium source and NaOH is 1:4:32; and
    the barium source material comprises $Ba(OH)_2$—$H_2O$ or $BaCl_2$, the liquid titanium source comprises $TiCl_4$ or butyl titanate, and a concentration of the barium ions in the barium source is 0.1 mol/L~0.4 mol/L.

16. The method for preparing a flexible cover plate according to claim 13, wherein a filling degree of the reaction vessel is 60%~80%, which can be adjusted by a manner of adding deionized water;
    the washing is performed by adding deionized water for washing five to eight times; and
    the drying is performed in a blast drier at 50° C. to 60° C. for 24 hours or more.

17. The method for preparing a flexible cover plate according to claim 13, wherein the flexible material is processed by means of physical vapor deposition, chemical vapor deposition or physical coating to obtain a flexible cover plate.

* * * * *